(12) United States Patent
Ware et al.

(10) Patent No.: US 11,349,496 B2
(45) Date of Patent: *May 31, 2022

(54) MEMORY CONTROLLER AND METHOD OF DATA BUS INVERSION USING AN ERROR DETECTION CORRECTION CODE

(71) Applicant: Rambus Inc., San Jose, CA (US)

(72) Inventors: Frederick A. Ware, Los Altos Hills, CA (US); John Eric Linstadt, Palo Alto, CA (US)

(73) Assignee: Rambus Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/321,060

(22) Filed: May 14, 2021

(65) Prior Publication Data

US 2021/0344352 A1 Nov. 4, 2021

Related U.S. Application Data

(63) Continuation of application No. 16/690,764, filed on Nov. 21, 2019, now Pat. No. 11,025,274, which is a
(Continued)

(51) Int. Cl.
*H03M 13/05* (2006.01)
*G06F 11/10* (2006.01)
(Continued)

(52) U.S. Cl.
CPC .......... *H03M 13/05* (2013.01); *G06F 3/0619* (2013.01); *G06F 3/0653* (2013.01);
(Continued)

(58) Field of Classification Search
CPC ...... H03M 13/05; H03M 13/19; H03M 13/09; H03M 13/1102; H03M 13/151;
(Continued)

(56) References Cited

U.S. PATENT DOCUMENTS 5,983,385 A  11/1999  Khayrallah et al.
6,584,526 B1 * 6/2003  Bogin .................... G06F 11/10
                                                        710/124
(Continued)

OTHER PUBLICATIONS

Bae, Seung-Ju, et al., "An 80 nm 4 Gv/s/pin 32 bit 512 Mb GDDR4 Graphics DRAM With Low Power and Low Noise Data Bus Inversion", IEEE Journal of Solid-State Circuits, vol. 43, No. 1, Jan. 2008, pp. 121-131. 11 Pages.
(Continued)

*Primary Examiner* — John J Tabone, Jr.
(74) *Attorney, Agent, or Firm* — Lance Kreisman; Peninsula Patent Group

(57) ABSTRACT

Memory controllers, devices and associated methods are disclosed. In one embodiment, a memory controller includes write circuitry to transmit write data to a memory device, the write circuitry includes a write error detection correction (EDC) encoder to generate first error information associated with the write data. Data bus inversion (DBI) circuitry conditionally inverts data bits associated with each of the write data words based on threshold criteria. Read circuitry receives read data from the memory device. The read circuitry includes a read EDC encoder to generate second error information associated with the received read data. Logic evaluates the first and second error information and conditionally reverse-inverts at least a portion of the read data based on the decoding.

20 Claims, 4 Drawing Sheets

Related U.S. Application Data continuation of application No. 15/973,280, filed on May 7, 2018, now Pat. No. 10,505,565, which is a continuation of application No. 14/941,564, filed on Nov. 14, 2015, now Pat. No. 9,979,416.

(60) Provisional application No. 62/090,300, filed on Dec. 10, 2014.

(51) Int. Cl.
*G06F 13/16* (2006.01)
*G06F 3/06* (2006.01)
*H03M 13/09* (2006.01)
*H03M 13/11* (2006.01)
*H03M 13/15* (2006.01)
*H03M 13/19* (2006.01)

(52) U.S. Cl.
CPC ........ *G06F 3/0673* (2013.01); *G06F 11/1004* (2013.01); *G06F 11/1008* (2013.01); *G06F 11/1016* (2013.01); *G06F 11/1048* (2013.01); *G06F 11/1068* (2013.01); *G06F 13/1668* (2013.01); *H03M 13/09* (2013.01); *H03M 13/1102* (2013.01); *H03M 13/151* (2013.01); *H03M 13/1515* (2013.01); *H03M 13/19* (2013.01)

(58) Field of Classification Search
CPC ............ H03M 13/1515; G06F 13/1668; G06F 3/0619; G06F 3/0653; G06F 3/0673; G06F 11/1004; G06F 11/1008; G06F 11/1016; G06F 11/1048; G06F 11/1068
USPC ....... 714/768, 764, 763, 773, 774, 777, 785, 714/799, 800
See application file for complete search history.

(56) References Cited

U.S. PATENT DOCUMENTS

| | | | | |
|---|---|---|---|---|
| 7,869,525 B2* | 1/2011 | Macri | ........................ | H03L 7/07 375/257 |
| 7,949,929 B2* | 5/2011 | Liang | .................. | G06F 11/1068 714/769 |
| 8,060,813 B2 | 11/2011 | Yoon et al. | | |
| 8,405,529 B2* | 3/2013 | Chang | .................. | G06F 13/4072 341/55 |
| 8,407,558 B2 | 3/2013 | Abbasfar | | |
| 8,612,828 B2 | 12/2013 | Brzezinski | | |
| 8,656,259 B2* | 2/2014 | Takahashi | ............ | H04L 1/0045 714/777 |
| 8,677,211 B2* | 3/2014 | Bandholz | ............ | G06F 11/1048 714/763 |
| 9,116,828 B2* | 8/2015 | Hollis | ................. | G06F 11/1048 |
| 9,459,952 B2* | 10/2016 | Abbasfar | ............ | G06F 11/0793 |
| 2003/0110425 A1* | 6/2003 | Yun | ........................ | G11C 29/40 714/718 |
| 2004/0153902 A1* | 8/2004 | Machado | ............ | G06F 11/1068 714/710 |
| 2005/0289435 A1 | 12/2005 | Mulla et al. | | |
| 2006/0098320 A1 | 5/2006 | Koga et al. | | |
| 2007/0214403 A1 | 9/2007 | Longwell et al. | | |
| 2007/0271495 A1 | 11/2007 | Shaeffer et al. | | |
| 2008/0155378 A1 | 6/2008 | Amidi | | |
| 2008/0225603 A1 | 9/2008 | Hein | | |
| 2008/0288844 A1 | 11/2008 | Nieuwland | | |
| 2009/0019344 A1* | 1/2009 | Yoon | ................... | G06F 11/1004 714/807 |
| 2009/0110109 A1* | 4/2009 | Skerlj | .................. | H04L 1/0057 375/295 |
| 2009/0193290 A1 | 7/2009 | Arimilli et al. | | |
| 2009/0313521 A1* | 12/2009 | Hollis | ................. | G06F 11/1004 714/752 |
| 2010/0042889 A1* | 2/2010 | Hargan | ................... | G06F 11/10 714/752 |
| 2011/0084737 A1* | 4/2011 | Oh | ......................... | H04L 25/49 327/108 |
| 2012/0144276 A1* | 6/2012 | Hargan | .................. | G06F 11/10 714/800 |
| 2013/0061006 A1* | 3/2013 | Hein | ................ | G11C 7/1087 711/154 |
| 2013/0132660 A1* | 5/2013 | Li | ....................... | G06F 11/1004 711/105 |
| 2013/0227210 A1* | 8/2013 | Walker | ................ | G11C 11/4096 711/105 |
| 2013/0266047 A1* | 10/2013 | Sudhakaran | ........ | H04L 25/4908 375/219 |
| 2014/0006904 A1 | 1/2014 | Gendler | | |
| 2014/0289440 A1* | 9/2014 | Shu | ..................... | G06F 13/4282 710/307 |
| 2015/0095748 A1* | 4/2015 | Abbasfar | ............ | G06F 11/1004 714/819 |
| 2015/0179263 A1* | 6/2015 | Anholt | ................ | G11C 11/5642 365/185.03 |
| 2015/0212156 A1* | 7/2015 | Bourstein | ............. | H04L 1/0042 714/744 |
| 2015/0227417 A1* | 8/2015 | Kim | .................... | G06F 11/1008 714/764 |
| 2015/0356047 A1* | 12/2015 | Ayyapureddi | ........ | H03M 13/31 714/752 |
| 2016/0034340 A1* | 2/2016 | Dono | .................. | G06F 11/1004 714/758 |

OTHER PUBLICATIONS

Hollis, Timothy M., "Data Bus Inversion in High-Speed Memory Applications", IEEE Transactions on Circuits and Systems-II: Express Briefs, vol. 56, No. 4, Apr. 2009, pp. 300-304. 5 Pages.

* cited by examiner

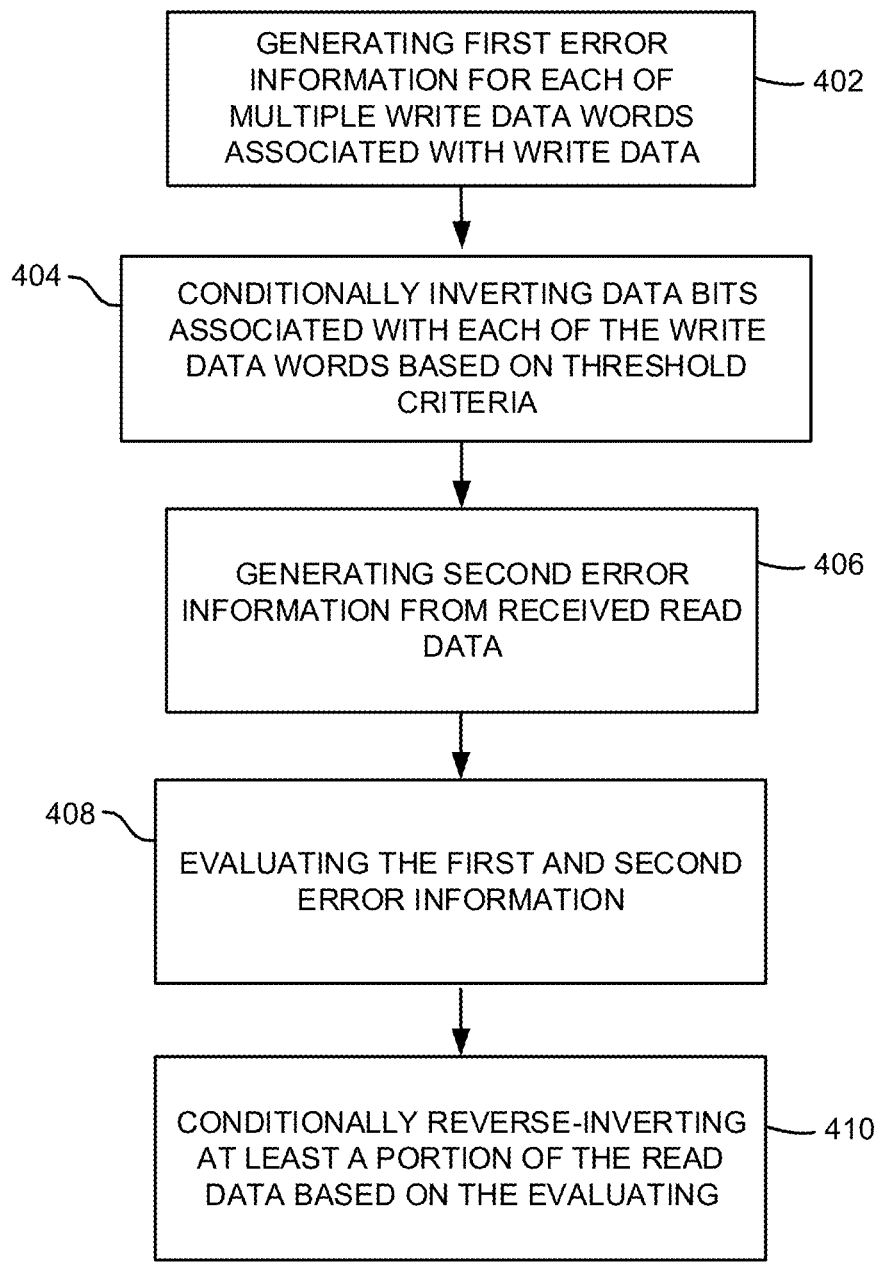

MEMORY CONTROLLER AND METHOD OF DATA BUS INVERSION USING AN ERROR DETECTION CORRECTION CODE

CROSS-REFERENCE TO RELATED APPLICATIONS

This application is a Continuation of U.S. Ser. No. 16/690,764, filed Nov. 21, 2021, entitled MEMORY CONTROLLER AND METHOD OF DATA BUS INVERSION USING AN ERROR DETECTION CORRECTION CODE, which is a Continuation of U.S. Ser. No. 15/973,280, filed May 7, 2018, entitled MEMORY CONTROLLER AND METHOD OF DATA BUS INVERSION USING AN ERROR DETECTION CORRECTION CODE, now U.S. Pat. No. 10,505,565, which is a Continuation of U.S. Ser. No. 14/941,564, filed Nov. 14, 2015, entitled MEMORY CONTROLLER AND METHOD OF DATA BUS INVERSION USING AN ERROR DETECTION CORRECTION CODE, now U.S. Pat. No. 9,979,416, which is a Non-Provisional that claims priority to U.S. Provisional Application No. 62/090,300, filed Dec. 10, 2014, entitled MEMORY CONTROLLER AND METHOD OF DATA BUS INVERSION USING AN ERROR DETECTION CORRECTION CODE, all of which are incorporated herein by reference in their entirety.

TECHNICAL FIELD

The disclosure herein relates to memory controllers, memory devices, and associated methods.

BACKGROUND

Data Bus Inversion (DBI) is a coding technique often employed by memory systems to simplify power delivery networks by minimizing supply current switching transients. The technique generally involves inverting logical "1"s or "0"s for a given set of bits based on predefined criteria.

While the DBI technique works well for its intended applications, conventional implementations typically utilize a separate control pin to provide a signal along a dedicated signal path between a memory controller and a memory device, the signal indicating whether a given set of bits is DBI-encoded. For relatively narrow memory device interfaces having, for example, four data links for transferring read and write data (a four-bit wide interface), the extra pin for DBI control purposes is often unduly burdensome. As a result, DBI encoding is often not utilized for narrow memory devices.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 4 illustrates a flowchart of steps carried out in one embodiment of a method.

DETAILED DESCRIPTION

Memory controllers, devices and associated methods are disclosed. In one embodiment, a portion of the code-space provided by an error detection correction (EDC) code is used to provide an indication of whether read data received by a memory controller is DBI-encoded. The memory controller includes write circuitry to transmit write data to a memory device, the write circuitry includes a write error detection correction (EDC) encoder to generate first error information associated with the write data. Data bus inversion (DBI) circuitry conditionally inverts data bits associated with each of the write data words based on threshold criteria. Read circuitry receives read data from the memory device. The read circuitry includes a read EDC encoder to generate second error information associated with the received read data. Logic evaluates the first and second error information and conditionally reverse-inverts at least a portion of the read data based on the decoding. By utilizing a portion of the code-space provided by the EDC code to provide an indication of whether the received read data is DBI-encoded, chip pin count may be reduced.

Figure 1:
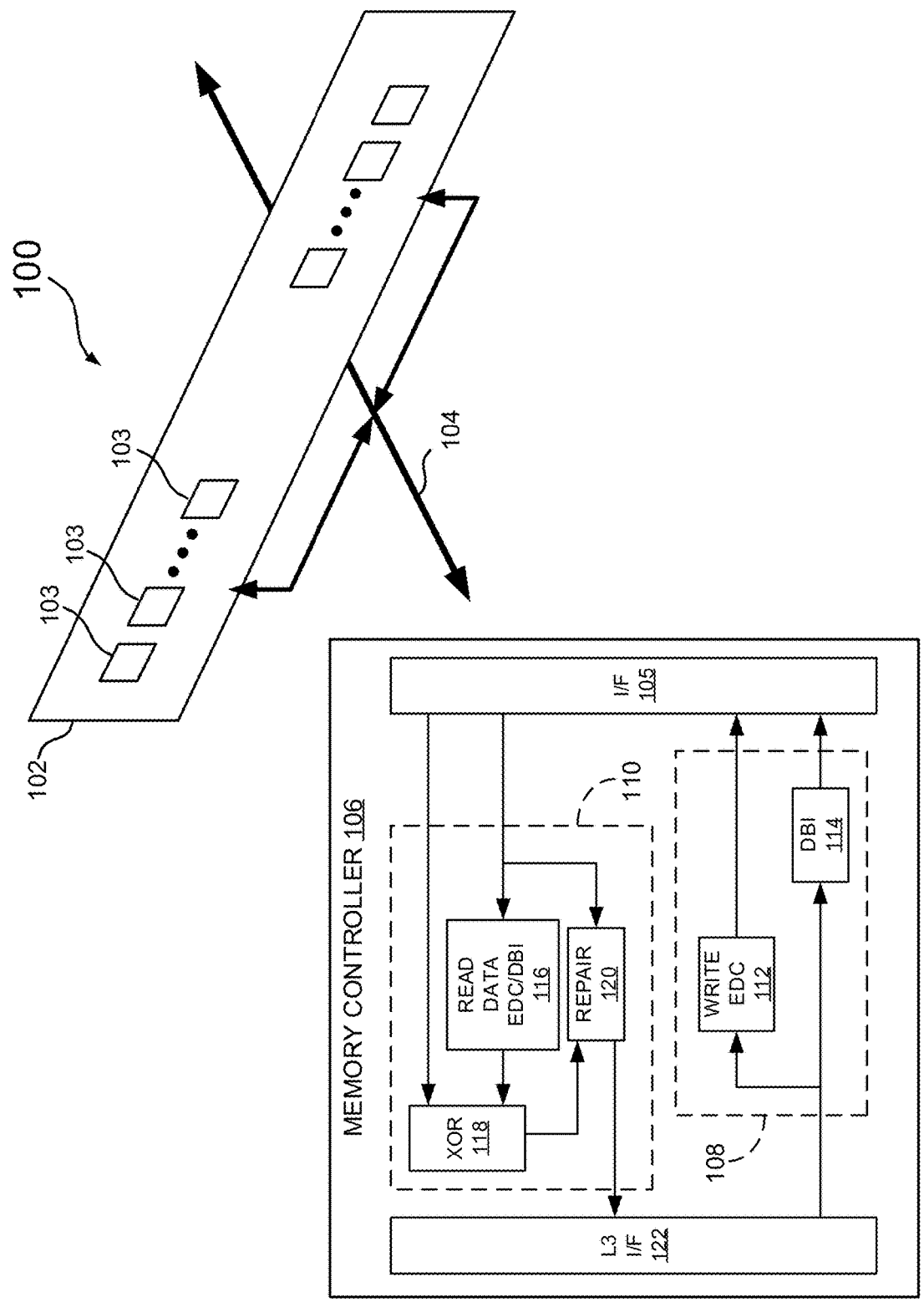
FIG. 1 illustrates one embodiment of a memory system that employs a memory controller and a memory device.

Referring to FIG. 1, one embodiment of a memory system, generally designated 100, employs one or more memory modules 102 coupled to a primary bus 104 via an interface 105. Memory control circuitry 106 in the form of a memory controller is also coupled to the primary bus 104 to direct data transfers between the module 102 and the memory control circuitry 106. The memory module 102 includes one or more memory devices 103. For one specific embodiment, the memory devices are dynamic random access memory devices (DRAMs) that each have a 4-bit wide data interface. A module with 18 such DRAM memory devices thus employs a 72-bit wide data interface.

With continued reference to FIG. 1, one specific embodiment of the memory control circuitry 106 may include, e.g., a discrete memory controller separate from a requestor integrated circuit (IC), or any IC that controls a memory device, such as a DRAM, and could be any type of system-on-chip (SoC). One embodiment of the memory control circuitry 106 employs write circuitry 108 and read circuitry 110. The write circuitry 108 includes a write error detection correction (EDC) encoder 112 and a data bus inversion (DBI) encoder 114. The write EDC encoder 112 generates error information, such as EDC parity bits, associated with write data symbols. The error encoding may be generated in accordance with one of many acceptable EDC algorithms including, for example, straightforward single-bit Hamming codes, to more sophisticated high-speed BCH (Bose, Ray-Chaudhuri and Hocquenghem) codes. Other EDC codes, such as Reed-Solomon codes, turbo codes, cyclic redundancy codes (CRC) and low density parity check (LDPC) codes may also be acceptable.

For one specific embodiment, a "Chipkill" EDC code is employed for both write and read transactions. The "Chipkill" error correction code has a (144, 128) format capable of correcting any single 4-bit symbol error in a 36 symbol word. A total of 144 bits are generated from a coding of a 128-bit data word, with the result being the original 128-bit (32 4-bit symbol) data interspersed with 16 (4 4-bit symbol) parity bits that, when decoded, generate an error syndrome. Similar Hamming-type coding schemes may be extended to 512 bit data chunks (576, 512), or higher. In general, decoding the syndrome following receipt of a data word allows for the detection of an error, and provides a pointer to the location of the error in the word.

Further referring to FIG. 1, the write data symbols may also be selectively inverted by the DBI encoder 114. Generally, the write data symbols have binary values, including a first value (such as a logical '0') and a second value (such as a logical '1'). Moreover, in some embodiments the DBI code implemented in the DBI encoding technique selectively inverts a set of M write data symbols if there are more than a pre-determined number N of symbols that have a first value. For example, if M=8 and there are more than four symbols that have the second value in the M symbols, symbols that have the first value may be converted into symbols that have the second value, and symbols that have the second value may be converted into symbols that have the first value. In this way, the number of symbols that have the second value in the M symbols may be four or fewer, which may reduce simultaneous switching noise. In other embodiments the DBI coding constraint may be that a population count of the number of symbols that have the first value in the M symbols is four or fewer. For some embodiments, the DBI encoder 114 may also invert the write data parity bits. The selectively inverted write data symbols and the EDC parity bits are passed along to the one or more memory modules 102 along the primary bus 104.

As noted above, one specific embodiment of a memory module 102 includes eighteen four-bit wide memory devices 103, corresponding to data transfers of seventy-two bit data words. Employing two modules thus involves data transfers of one-hundred-forty-four bits. The selectively inverted write data words, along with the corresponding set of sixteen parity bits are stored in the modules 102 until retrieved via read operations.

To carry out the read operations, the read circuitry 110 employed by the memory control circuitry 106 includes logic to carry out (1) EDC encoding of received read data to generate read data parity bits, (2) EDC decoding of received write data parity bits associated with the read data, and (3) DBI decoding of read data symbols without the need for a dedicated pin indicating whether or not the read data is DBI encoded. The logic includes a read EDC encoder 116 that generates error information, such as read parity bits, from received read data. The read parity bits are fed to an XOR circuit 118, where they are compared with write parity information transferred with the read data from the memory modules 102, creating the EDC syndrome. The original read data and the resulting syndrome are then fed to a repair circuit 120, which evaluates the error syndrome that indicates whether the read data includes any errors. The repair circuit 120 also determines whether the read data is DBI-encoded. The repair circuit detects and corrects read data errors and carries out any data bit inversions before passing the data to a Level 3 cache interface 122.

Figure 2:
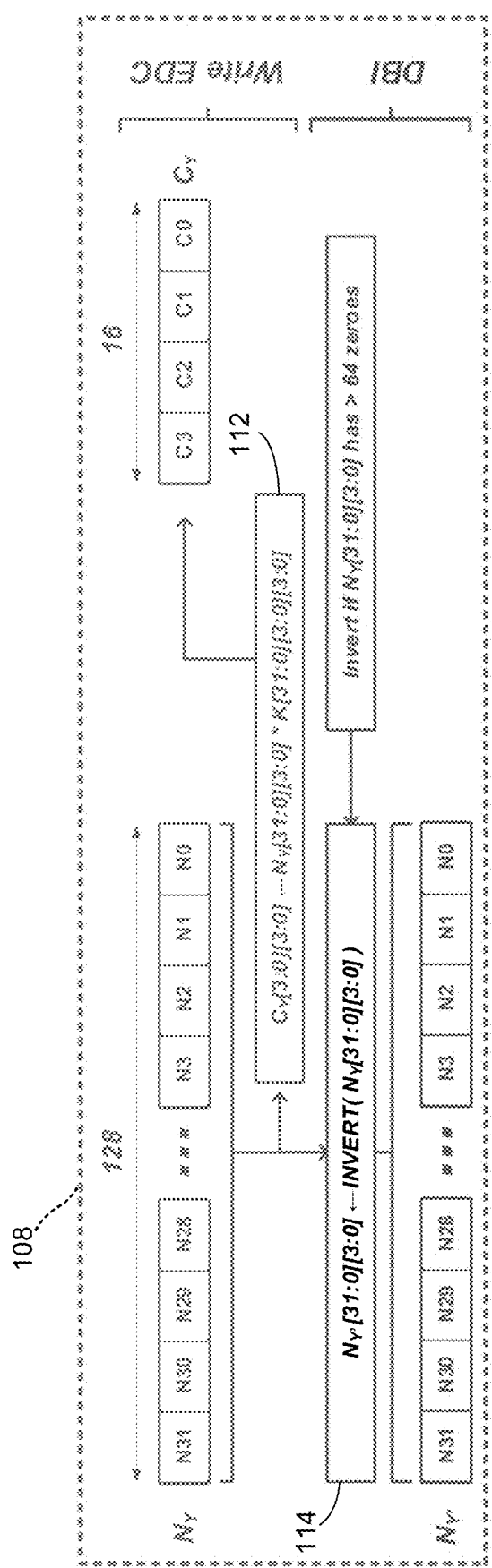
FIG. 2 illustrates further detail of one embodiment of the write circuitry in the memory controller of FIG. 1.

FIG. 2 illustrates one specific embodiment of a data flow corresponding to the write circuitry 108 of FIG. 1. A set of thirty-two four-bit symbols (two 72-bit data words) $N_Y$ are error encoded by the symbol-based write EDC encoder 112 (via error processing involving Kij coefficients) to produce a copy of the write data and a four-symbol (16-bit) set of parity bits $C_Y$. The write data is then selectively inverted by the DBI encoder 114 based on one or more predefined constraints, such as whether the data word has, for example, more than sixty-four logical "zeroes." The selectively inverted write data $N_{Y'}$ (128 bits) and the parity bits (16 bits) may then transferred to, for example, two memory modules, where respective 72-bit data words are written to the eighteen 4-bit memory devices, along with a corresponding subset of the parity bits. For some embodiments, the write data parity bits may also be selectively inverted by the DBI encoder 114.

Figure 3:
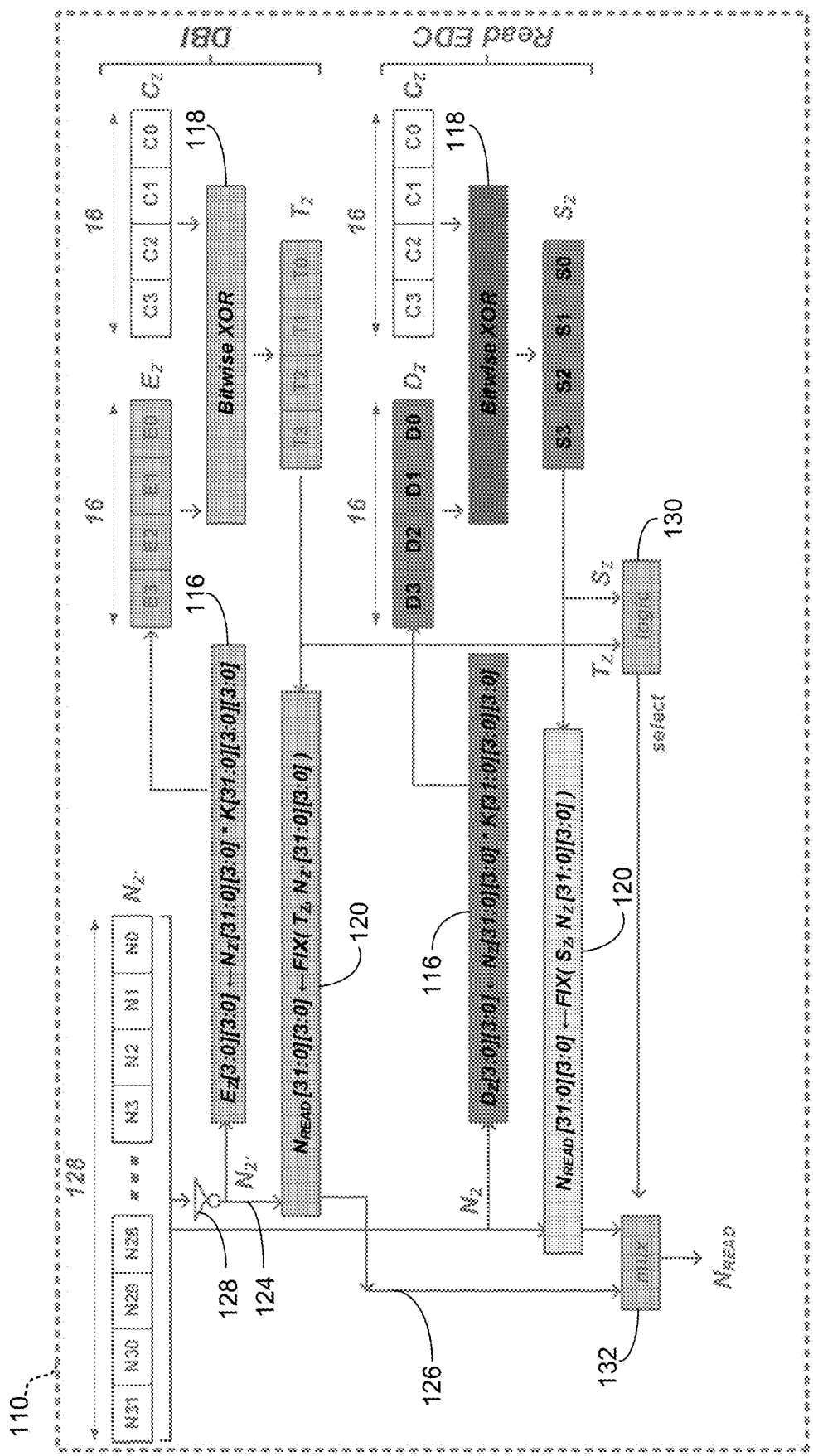
FIG. 3 illustrates further detail of one embodiment of the read circuitry in the memory controller of FIG. 1.

FIG. 3 illustrates further detail of a data flow associated with one specific embodiment of the read circuitry 110 of FIG. 1. Read data $N_{Z'}$ sent to the memory control circuitry 106 is processed along alternative inverting and noninverting read data paths 124 and 126. The inverting data path 124 includes inversion circuitry 128 to reverse-invert the received read data with the assumption that it was originally DBI-encoded when written to the memory module(s) 102. The inverted read data is then EDC encoded by the read EDC encoder 116 to generate read parity symbols $E_Z$. The read parity symbols $E_Z$ are then compared to the write parity symbols $C_Z$ that accompanied the read data during the read data transfer. The XOR circuitry 118 sums the read and write parity symbols to generate a resulting syndrome $T_Z$. The inverted read data and resulting syndrome $T_Z$ then undergo an EDC decoding process with the repair circuitry 120 to evaluate the error syndrome that defines an error signature.

Further referring to FIG. 3, the EDC decoding process carried out by the repair circuitry 120 generally involves evaluating the error syndrome to determine whether a correctable error was detected. This evaluation also involves generating a pointer to the symbol location of the error (if any) in the read data word. If no error is detected, no action takes place. If an error is detected and located, then the identified symbol may be corrected to the proper value. The repair circuitry also assesses whether the resulting codeword is valid, correctable, or uncorrectable, based on a first probability value, for example.

Further referring to FIG. 3, the noninverted read data transferred on the noninverting read data path 126 is also EDC coded by the EDC encoder 120 to generate noninverted read data parity symbols $D_Z$ that are bit-wise XORed with the write parity symbols $C_Z$. The resulting noninverted syndrome symbols $S_Z$, constructed from the non-inverted data and parity symbols are then EDC evaluated by the repair circuitry 116, similar to the processing carried out on the inverted read data, by repair circuitry 120. Once the syndrome is generated, a determination of whether an error was detected from the syndrome is first carried out. This generally involves not only detectection of the existence of an error, but also generation of a pointer to the symbol location of the error in the read data word. If no error is detected, no action takes place. If an error is detected and located, then the identified symbol may be corrected to a proper value. The repair circuitry also assesses whether the resulting codeword is valid, correctable, or uncorrectable based on a first probability value, for example.

With continued reference to FIG. 3, the repair circuitry 120 includes selection logic 130 that evaluates the probabilities of each of the resulting repaired inverted and noninverted codewords. The more likely codeword, corresponding to the highest validity probability, is selected. A control bit is then generated and forwarded to a control input for a multiplexer 132. The multiplexer then passes the selected codeword to the Level 3 cache interface 122 based on the control bit value.

FIG. 4 sets forth a series of steps consistent with a method of controlling write and read accesses between a memory controller and a memory device consistent with the structural embodiments described with respect to FIGS. 1 through 3. At 402, a symbol-based EDC code, representing first error information, is generated for each of multiple write data words associated with write data. Data bits associated with each of the write data words are then conditionally inverted based on threshold criteria, at 404. When receiving read data, second error information is generated from the read data, at 406. The first and second error information is evaluated, at 408, and at least a portion of the decoded read data bits are then conditionally reverse-inverted based on the evaluating, at 410.

Embodiments of one or more of these circuits, integrated circuits, systems and/or techniques may be used during inter-chip and/or intra-chip communication. For example, these techniques may be used in memory systems that include different types of memory chips, such as: volatile memory, non-volatile memory, dynamic random access memory (DRAM), static random access memory (SRAM), read-only memory (ROM), erasable programmable read-only memory (EPROM), electrically erasable programmable read-only memory (EEPROM), flash, solid-state memory, and/or another type of memory. Moreover, for a given type of memory, these techniques may be used in different memory technologies or technology generations (which may use different power supply voltages). For example, these techniques may be used in: extreme data rate (XDR), dual-data rate (DDR), graphics dual-data rate (GDDR) and/or synchronous DRAM, such as: DDR2, DDR3, DDR4, DDRx, GDDR1, GDDR3, GDDR5, and/or mobile DDR and successive generations such as LPDDR3 and LPDDR4.

Those skilled in the art will appreciate that the embodiments described above provide an indication whether received read data is DBI-encoded without the need for a dedicated or additional DBI control pin. This not only enables narrow-width devices to support DBI encoding, but also improves pin count efficiencies for devices that already support DBI encoding.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "I" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A memory module, comprising:
   a substrate;
   multiple memory devices disposed on the substrate;
   a multi-bit data interface including multiple data pins defining a multi-bit width;
   the multiple memory devices to receive write data bits from a memory controller via the multi-bit data interface, the write data bits selectively inverted by the memory controller in accordance with a Data Bus Inversion (DBI) coding scheme;
   the multiple memory devices to store the selectively inverted write data bits; and
   the multiple memory devices to transmit the selectively inverted write data bits as read data to the memory controller via the multiple data pins in response to a read command, the read data unaccompanied by a control signal from the memory module to indicate whether the read data is DBI-encoded, the multiple memory devices not including a DBI control pin to transmit the control signal.

2. The memory module according to claim 1, wherein the write data bits selectively inverted by the memory controller are received as encoded write data in accordance with an error detection/correction (EDC) code, the encoded write data including first error information associated with the write data bits.

3. The memory module according to claim 2, wherein the EDC code enables detection of a first class of errors, and correction of a second class of errors.

4. The memory module according to claim 2, wherein:
the multi-bit data interface defines at least a 72-bit width; and
the EDC code includes symbols that each have a group of four data bits.

5. The memory module according to claim 4, wherein the EDC code comprises a Chipkill EDC code.

6. The memory module according to claim 2, wherein:
the first error information is transmitted by the multiple memory devices with the read data in response to the read command; and
wherein an indication of whether the read data is DBI-encoded is based on the first error information.

7. The memory module according to claim 1, embodied as a dynamic random access (DRAM) memory module.

8. A method of operation in a memory module, the memory module including multiple memory devices disposed on a substrate, the method comprising:
receiving, at the memory module, write data bits from a memory controller, the write data bits received as selectively inverted by the memory controller in accordance with a Data Bus Inversion (DBI) coding scheme;
storing, in each of the multiple memory devices, respective portions of the selectively inverted write data bits; and
transmitting, from each of the multiple memory devices, the respective portions of the selectively inverted write data bits as read data to the memory controller in response to a read command, the read data unaccompanied by a control signal from the memory module to indicate whether the read data is DBI-encoded, the multiple memory devices not including a DBI control pin to transmit the control signal.

9. The method of claim 8, wherein the receiving of the write data bits from the memory controller further comprises:
receiving the write data bits further encoded by the memory controller in accordance with an error detection/correction (EDC) code to generate first error information.

10. The method of claim 9, further comprising:
receiving the first error information from the memory controller.

11. The method of claim 9, wherein the EDC code enables detection of a first class of errors, and correction of a second class of errors.

12. The method of claim 9, wherein the EDC code comprises a Chipkill EDC code.

13. The method of claim 9, wherein the transmitting further comprises:
transmitting, from each of the multiple memory devices, respective portions of the first error information with corresponding portions of the read data in response to the read command; and
wherein an indication of whether the read data is DBI-encoded is based on the first error information.

14. A dynamic random access memory (DRAM) memory module comprising:
a substrate;
multiple DRAM integrated circuit (IC) memory devices disposed on the substrate;
a multi-bit data interface including multiple data pins defining a multi-bit width;
the multiple memory devices to receive write data bits from a DRAM IC memory controller via the multi-bit data interface, the write data bits selectively inverted by the DRAM IC memory controller in accordance with a Data Bus Inversion (DBI) coding scheme;
the multiple DRAM IC memory devices to store the selectively inverted write data bits; and
the multiple DRAM IC memory devices to transmit the selectively inverted write data bits as read data to the DRAM IC memory controller via the multiple data pins in response to a read command, the read data unaccompanied by a control signal from the memory module to indicate whether the read data is DBI-encoded, the multiple memory devices not including a DBI control pin to transmit the control signal.

15. The DRAM memory module according to claim 14, wherein the write data bits selectively encoded by the DRAM IC memory controller are further encoded by the DRAM IC memory controller in accordance with an error detection/correction (EDC) code to generate first error information.

16. The DRAM memory module according to claim 15, wherein the EDC code enables detection of a first class of errors, and correction of a second class of errors.

17. The DRAM memory module according to claim 16, wherein:
the multi-bit data interface defines a 72-bit width.

18. The DRAM memory module according to claim 17, wherein the EDC code includes symbols that each have a group of four data bits.

19. The DRAM memory module according to claim 15, wherein the EDC code comprises a Chipkill EDC code.

20. The DRAM memory module according to claim 15, wherein:
the first error information is transmitted by the multiple DRAM IC memory devices with the read data in response to the read command; and
wherein an indication of whether the read data is DBI-encoded is based on the first error information.

* * * * *